United States Patent
Sano

(10) Patent No.: US 9,461,632 B2
(45) Date of Patent: Oct. 4, 2016

(54) OSCILLATOR CIRCUIT

(71) Applicant: Seiko Instruments Inc., Chiba-shi, Chiba (JP)

(72) Inventor: Minoru Sano, Chiba (JP)

(73) Assignee: SII Semiconductor Corporation, Chiba-Shi, Chiba (JP)

( * ) Notice: Subject to any disclaimer, the term of this patent is extended or adjusted under 35 U.S.C. 154(b) by 0 days.

(21) Appl. No.: 14/865,694

(22) Filed: Sep. 25, 2015

(65) Prior Publication Data

US 2016/0094206 A1  Mar. 31, 2016

(30) Foreign Application Priority Data

Sep. 30, 2014  (JP) ................. 2014-202020

(51) Int. Cl.
*H03K 3/023*  (2006.01)
*H03K 3/0231*  (2006.01)
*H03K 5/24*  (2006.01)
*H03K 3/014*  (2006.01)

(52) U.S. Cl.
CPC ............ *H03K 3/0231* (2013.01); *H03K 3/014* (2013.01); *H03K 5/24* (2013.01)

(58) Field of Classification Search
USPC ................................................ 331/150, 153
See application file for complete search history.

(56) References Cited

U.S. PATENT DOCUMENTS 8,054,141 B2 * 11/2011 Saw ..................... H03K 3/0231
                                                    331/111
8,786,375 B2 *  7/2014 Feldtkeller ............. H03K 3/011
                                                    327/185

FOREIGN PATENT DOCUMENTS

JP         2003-332889 A     11/2003

* cited by examiner

*Primary Examiner* — Joseph Chang
(74) *Attorney, Agent, or Firm* — Brinks Gilson & Lione

(57) ABSTRACT

Provided is a CR oscillator circuit that achieves a small occupied area and good oscillation frequency accuracy while having small current consumption. The CR oscillator circuit includes: a reference voltage circuit configured to switch and output a reference voltage; a first constant current source configured to charge a capacitor; a second constant current source configured to discharge the capacitor; a voltage comparator configured to compare voltages of the reference voltage circuit and the capacitor; and a logic circuit. The logic circuit is configured to switch between the reference voltage circuit and the constant current source simultaneously in response to an output signal of the voltage comparator.

1 Claim, 6 Drawing Sheets

OSCILLATOR CIRCUIT

RELATED APPLICATIONS

This application claims priority under 35 U.S.C. §119 to Japanese Patent Application No. 2014-202020 filed on Sep. 30, 2014, the entire content of which is hereby incorporated by reference.

BACKGROUND OF THE INVENTION

1. Field of the Invention

The present invention relates to a current controlled CR oscillator circuit, and more specifically, to a CR oscillator circuit that achieves small current consumption and a small occupied area.

2. Description of the Related Art

As an oscillator circuit to be used in an electronic device, a crystal oscillator circuit has hitherto been used, in which a semiconductor integrated circuit and a quartz resonator are combined. In the crystal oscillator circuit, when a parasitic capacitance exists near the semiconductor integrated circuit or the quartz resonator, an oscillation frequency may sometimes be deviated from a set value.

Incidentally, in recent years, electronic components have often been mounted at high density owing to a demand for downsizing of the electronic device, and hence the parasitic capacitance existing near the semiconductor integrated circuit or the quartz resonator has tended to be large. In view of this, as an oscillator circuit independent of the mounted state of the integrated circuit, a CR oscillator circuit has hitherto been known.

FIG. 6 is a circuit diagram for illustrating a related-art CR oscillator circuit.

The related-art CR oscillator circuit includes voltage comparators X1 and X2, reference voltage circuits VH and VL, constant current sources I1 and I2, switches S1 and S2, and a capacitor C.

The related-art CR oscillator circuit compares a triangular wave voltage, which is generated by the constant current sources I1 and I2 and the capacitor C, to reference voltages VH and VL by the voltage comparators X1 and X2, to thereby serve as a CR oscillator circuit configured to oscillate a voltage having upper and lower peaks corresponding to the reference voltages VH and VL.

The related-art CR oscillator circuit includes two voltage comparators and thus has a problem of increasing current consumption and an occupied area.

Moreover, an offset voltage is always generated at the voltage comparator, and hence the triangular wave voltage is compared to a voltage different from the set reference voltage, which leads to an oscillation frequency error. Further, the offset voltages of the two voltage comparators do not necessarily have constant voltage values, and hence it is difficult to predict the oscillation frequency error.

In general, a circuit including MOS transistors configured as a differential pair is often used as the voltage comparator. Now, the offset voltage of the voltage comparator is considered. The offset voltage is generated mainly when threshold voltages of the MOS transistors forming the differential pair configuration are deviated from each other. When the threshold voltages of the MOS transistors forming the differential pair configuration are respectively represented by VTH1 and VTH2, a difference ΔVTH between those threshold voltages is generally expressed by Expression 1.

$$\Delta VTH = \alpha \times tox / \sqrt{(W \times L)} \quad (1)$$

From Expression 1, it is found that increasing areas of the MOS transistors is a simple method for reducing the difference ΔVTH between the threshold voltages. However, the thickness tox of an oxide film is varied depending on manufacturing conditions, and hence simply increasing the areas of the transistors reduces the difference ΔVTH between the threshold voltages, but cannot keep the value constant. In addition, due to the large area of the transistor, a gate capacitance of the MOS transistor becomes larger as compared to the capacitor for generating a triangular wave voltage. As a result, increasing the areas may be a cause of the oscillation frequency error.

SUMMARY OF THE INVENTION

In view of the above-mentioned problems, the present invention provides a CR oscillator circuit that achieves small current consumption, a small occupied area, and good oscillation frequency accuracy.

In order to solve the above-mentioned problems, a CR oscillator circuit according to one embodiment of the present invention has the following configuration.

The CR oscillator circuit includes: a reference voltage circuit configured to switch and output a reference voltage; a first constant current source configured to charge a capacitor; a second constant current source configured to discharge the capacitor; a voltage comparator configured to compare voltages of the reference voltage circuit and the capacitor; and a logic circuit. The logic circuit is configured to switch between the reference voltage circuit and the constant current source simultaneously in response to an output signal of the voltage comparator.

A voltage obtained by adding or subtracting an offset voltage to or from the reference voltage serves as a reference voltage of the voltage comparator. In this case, the circuit has such a configuration that reference voltages VH and VL are switched in response to an output voltage of the voltage comparator, and hence an oscillation frequency is not deviated due to the offset voltage of the voltage comparator. Moreover, one voltage comparator is used, and hence the current consumption and the occupied area of the CR oscillator circuit may be reduced.

DETAILED DESCRIPTION OF THE PREFERRED EMBODIMENTS

First Embodiment

Figure 1:
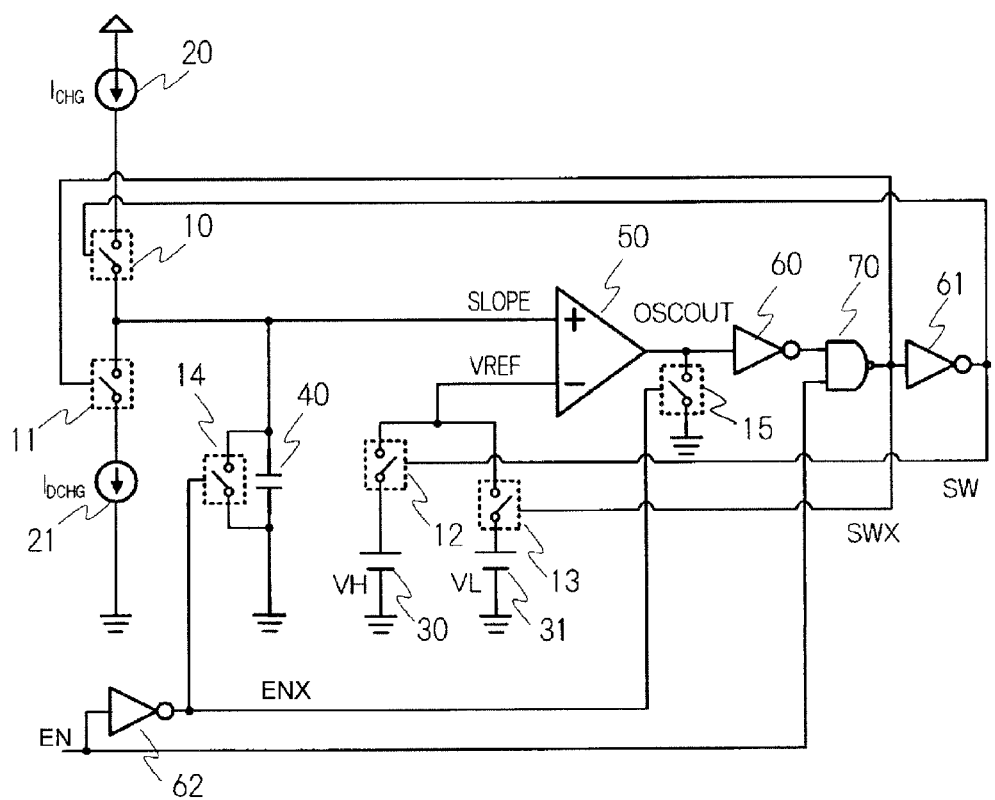
FIG. 1 is a circuit diagram for illustrating a CR oscillator circuit according to a first embodiment of the present invention.

FIG. 1 is a circuit diagram for illustrating a CR oscillator circuit according to a first embodiment of the present invention.

The CR oscillator circuit of the first embodiment includes constant current sources 20 and 21, a capacitor 40, reference voltage circuits 30 and 31, a voltage comparator 50, inverters 60, 61, and 62, a NAND circuit 70, and switches 10, 11, 12, 13, 14, and 15. The reference voltage circuit 30 outputs a reference voltage VH. The reference voltage circuit 31 outputs a reference voltage VL. The reference voltages have a relationship "reference voltage VH>reference voltage VL".

Connections in the CR oscillator circuit of the first embodiment are described.

The constant current source 20, the switch 10, the switch 11, and the constant current source 21 are connected in series between a power supply terminal and a ground terminal. A node SLOPE corresponds to a connection point between the switch 10 and the switch 11. The reference voltage circuit 30 is connected to a node VREF via the switch 12, and the reference voltage circuit 31 is connected to the node VREF via the switch 13. The voltage comparator 50 has a non-inverting input terminal connected to the node SLOPE, an inverting input terminal connected to the node VREF, and an output terminal connected to a node OSCOUT. The capacitor 40 and the switch 14 are connected in parallel to each other between the node SLOPE and the ground terminal. The switch 15 is connected between the node OSCOUT and the ground terminal. The inverter 60 has an input terminal connected to the node OSCOUT and an output terminal connected to one input terminal of the NAND circuit 70. The NAND circuit 70 has the other input terminal connected to an EN terminal and an output terminal connected to an input terminal of the inverter 61. The inverter 62 has an input terminal connected to the EN terminal. An output terminal of the inverter 61 serves as a node SW, an output terminal of the inverter 62 serves as a node ENX, and an output terminal of the NAND circuit 70 serves as a node SWX.

Selection terminals of the switch 10 and the switch 12 are connected to the node SW. Selection terminals of the switch 11 and the switch 13 are connected to the node SWX. Selection terminals of the switch 14 and the switch 15 are connected to the node ENX. The switches 10 to 15 are turned on when the selection terminals become HIGH, for example.

Figure 2:
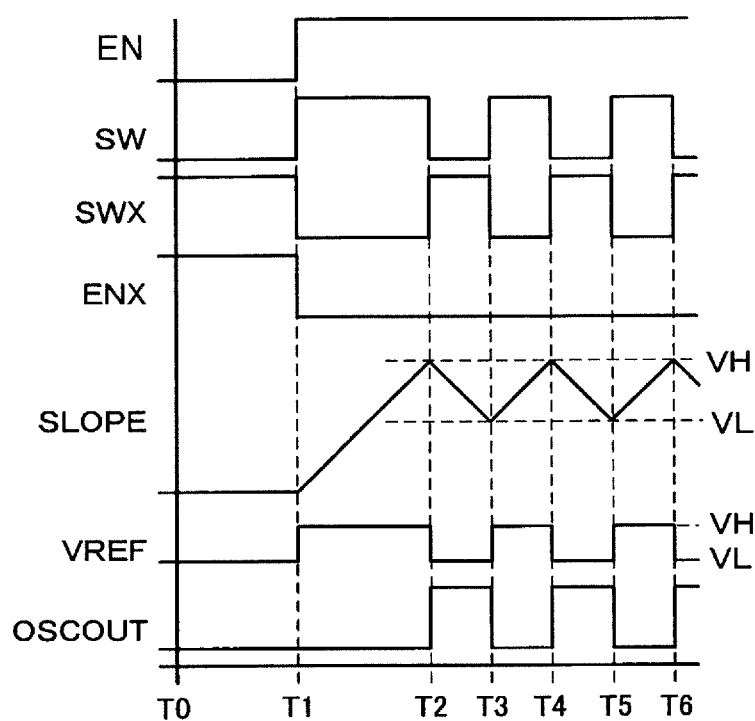
FIG. 2 is an operation waveform of the CR oscillator circuit of the first embodiment.

Next, operation of the CR oscillator circuit of the first embodiment is described. FIG. 2 is an operation waveform of the CR oscillator circuit of the first embodiment.

[Time T0 to Time T1]

The EN terminal is LOW (node ENX is HIGH) and the switches 14 and 15 are turned on, and hence the node SLOPE and the node OSCOUT are LOW.

The input terminal of the inverter 60 is LOW and the output terminal thereof is thus HIGH. The EN terminal is LOW and the output terminal of the NAND circuit 70 (node SWX) is thus HIGH to turn on the switches 11 and 13. Because the switch 13 is turned on, a voltage of the node VREF is the reference voltage VL. The voltage comparator 50 has the non-inverting input terminal being LOW and the inverting input terminal having the reference voltage VL, and hence the node OSCOUT is LOW.

[Time T1 to Time T2]

When the EN terminal becomes HIGH (node ENX becomes LOW) at time T1, the switches 14 and 15 are turned off and the CR oscillator circuit starts its operation. At this time, a voltage of the node SLOPE is still low and the output terminal of the voltage comparator 50 is thus LOW. In this case, both of the input terminals of the NAND circuit 70 are HIGH and the output terminal (node SWX) is thus LOW. Consequently, the switches 11 and 13 are turned off and the switches 10 and 12 are turned on. Because the switch 10 is turned on and the switch 11 is turned off, the constant current source 20 starts charging of the capacitor 40. Moreover, because the switch 13 is turned off and the switch 12 is turned on, the voltage of the node VREF becomes the reference voltage VH.

Then, due to the charging of the capacitor 40 by the constant current source 20, the voltage of the node SLOPE is increased from LOW with time. In this case, the constant current source 20 charges the capacitor 40 until the time point at which the voltage of the node SLOPE becomes the voltage VH of the node VREF. The voltage of the node SLOPE is determined as follows.

$$VSLOPE_{(T2-T1)} = (I_{CHG}/C) \times (T2-T1) \tag{2}$$

Because this voltage is equal to the reference voltage VH, the following is established.

$$VH = (I_{CHG}/C) \times (T2-T1) \tag{3}$$

From Expression 2 and Expression 3, the charging time (T2−T1) is expressed by Expression 4.

$$T2-T1 = VH \times (C/I_{CHG}) \tag{4}$$

In the expressions, $I_{CHG}$ represents a current of the constant current source 20 and C represents a capacitance of the capacitor 40.

[Time T2 to Time T3]

At time T2, the voltage of the non-inverting input terminal of the voltage comparator 50 exceeds the reference voltage VH of the inverting input terminal thereof, and hence the output terminal (node OSCOUT) becomes HIGH. Consequently, the one input terminal of the NAND circuit 70 becomes LOW and the node SW thus becomes LOW (node SWX becomes HIGH). Because the switch 12 is turned off and the switch 13 is turned on, the voltage of the node VREF becomes the reference voltage VL. Moreover, because the switch 10 is turned off and the switch 11 is turned on, the constant current source 21 discharges the capacitor 40, with the result that the voltage of the node SLOPE is decreased with time.

In this case, the constant current source 21 discharges the capacitor 40 until the time point at which the voltage of the node SLOPE becomes the voltage of the node VREF. The voltage of the node SLOPE is determined as follows.

$$VSLOPE_{(T3-T2)} = VH - (I_{DCHG}/C) \times (T3-T2) \tag{5}$$

Because this voltage is equal to the reference voltage VL, the following is established.

$$VL = VH - (I_{DCHG}/C) \times (T3-T2) \tag{6}$$

From Expression 5 and Expression 6, the discharging time (T3−T2) of the capacitor 40 is expressed by Expression 7.

$$T3-T2 = (VH-VL) \times (C/I_{DCHG}) \tag{7}$$

In the expressions, $I_{DCHG}$ represents a current of the constant current source 21.

[Time T3 to Time T4]

The voltage comparator 50 performs the similar operation as in the period from time T1 to time T2, that is, the switches 10 and 12 are turned on and the switches 11 and 13 are turned off. However, the charging of the node SLOPE is started with the node SLOPE having the reference voltage VL, and hence charging time (T4−T3) is expressed by Expression 8.

$$T4-T3 = (VH-VL) \times (C/I_{CHG}) \tag{8}$$

As can be seen from the operation waveform of FIG. 2, at and after time T2, the voltage of the node SLOPE is a triangular wave voltage having amplitude with the reference voltage VH as the upper side and the reference voltage VL as the lower side. The oscillation operation is accordingly continued at the output terminal of the voltage comparator 50. In this case, an oscillation cycle $T_{OSC}$ at and after time T2 is determined as Expression 9.

$$T_{OSC} = (T3 - T2) + (T4 - T3) \quad (9)$$
$$= (VH - VL) \times (C/I_{DCHG}) + (VH - VL) \times (C/I_{CHG})$$
$$= 2 \times (VH - VL) \times (C/I_{DCHG} + C/I_{CHG})$$

Next, an operation waveform when an offset voltage is generated at the voltage comparator 50 is described.

Figure 3:
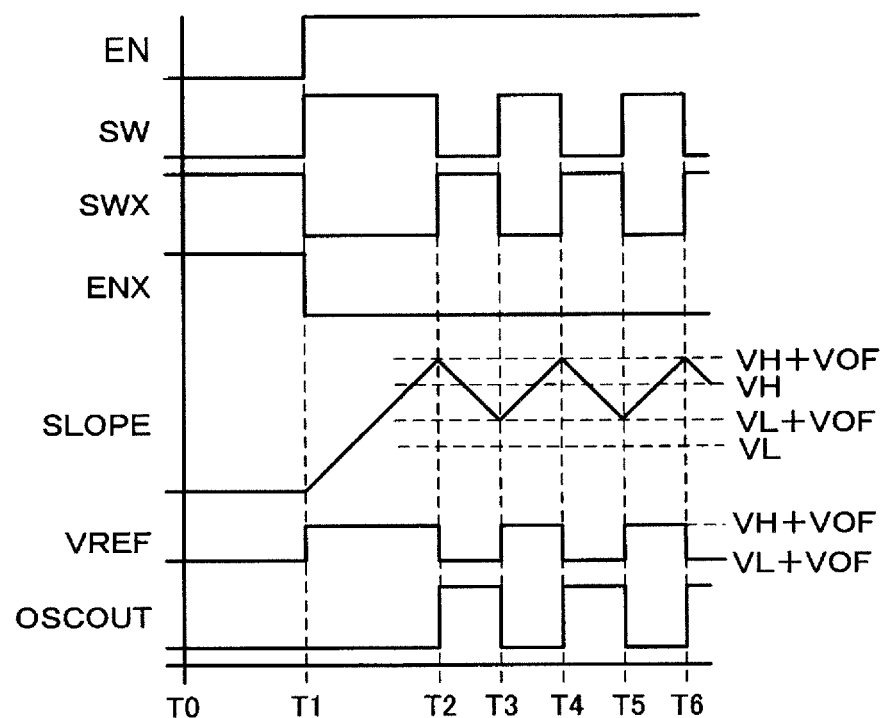
FIG. 3 is an operation waveform when an offset voltage is generated at a voltage comparator in the CR oscillator circuit of the first embodiment.

FIG. 3 is an operation waveform when an offset voltage VOF is generated at each of the input terminals of the voltage comparator 50 in the CR oscillator circuit of the first embodiment. It is assumed in the operation waveform example of FIG. 3 that the offset voltage is a positive voltage, but the offset voltage may be a negative voltage.

An oscillation cycle $T_{OSC}'$ is determined in the similar manner described above.

$$T3' - T2' = ((VH + VOF) - (VL + VOF)) \times (C/I_{CHG}) \quad (10)$$
$$= (VH - VL) \times (C/I_{CHG})$$

$$T4' - T3' = ((VH + VOF) - (VL + VOF)) \times (C/I_{DCHG}) \quad (11)$$
$$= (VH - VL) \times (C/I_{DCHG})$$

$$T_{OSC}' = 2 \times (VH - VL) \times (C/I_{DCHG} + C/I_{CHG}) \quad (12)$$

From FIG. 3 and Expression 12 that does not have the term of the offset voltage VOF, it is found that the offset voltage VOF at each of the input terminals of the voltage comparator 50 can be cancelled. The CR oscillator circuit of this embodiment can therefore improve oscillation frequency accuracy.

Second Embodiment

Figure 4:
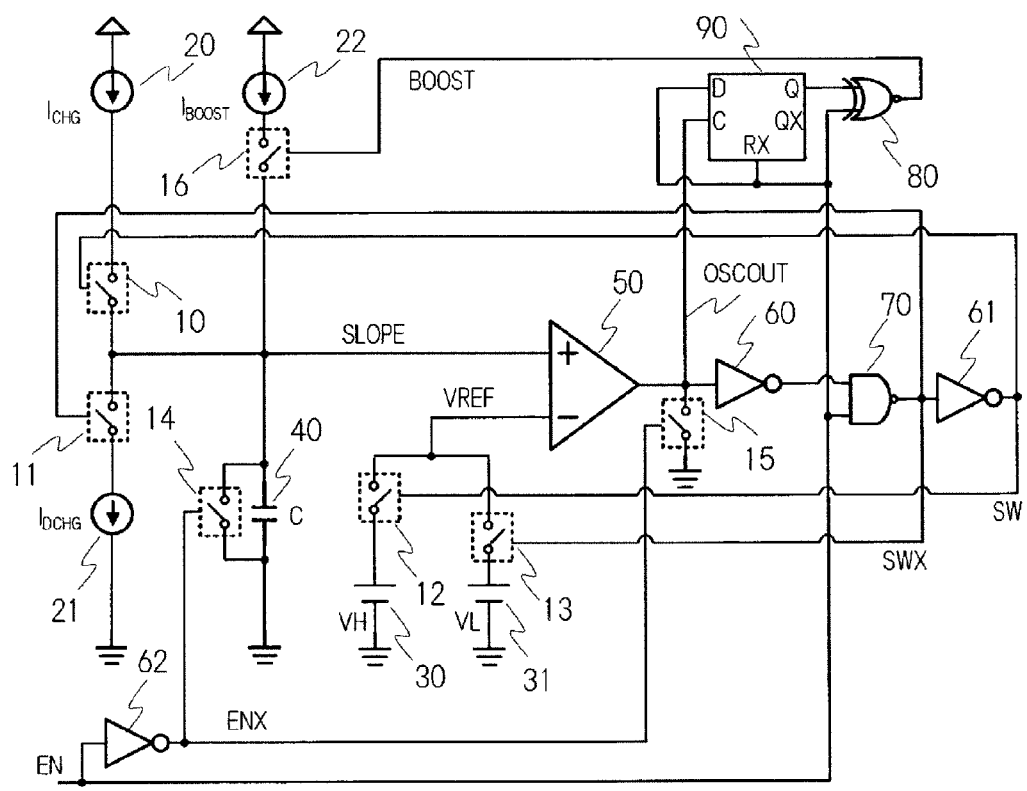
FIG. 4 is a circuit diagram for illustrating a CR oscillator circuit according to a second embodiment of the present invention.

FIG. 4 is a circuit diagram of a CR oscillator circuit according to a second embodiment of the present invention. FIG. 4 differs from FIG. 1 in that a constant current source 22, a DFF 90, an EXOR 80, and a switch 16 are added. The constant current source 22 causes a current $I_{BOOST}$ to flow, which is larger than the current $I_{CHG}$ of the constant current source 20.

Only parts of connections in the CR oscillator circuit of the second embodiment, which are changed from the CR oscillator circuit of the first embodiment, are described.

The DFF 90 has a D terminal and an RX terminal to which the EN terminal is connected, and a C terminal to which the node OSCOUT is connected. The EXOR 80 has one input terminal to which the EN terminal is connected, and the other input terminal to which a Q terminal of the DFF 90 is connected. The constant current source 22 and the switch 16 are connected in series between the power supply terminal and the node SLOPE. A selection terminal of the switch 16 is connected to an output terminal of the EXOR 80.

Figure 5:
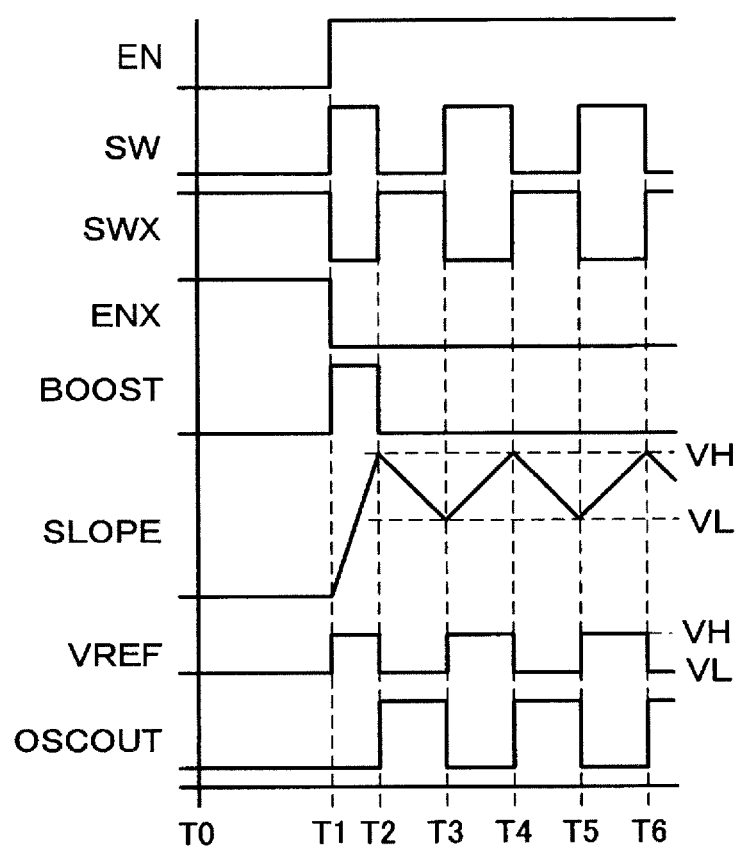
FIG. 5 is an operation waveform of the CR oscillator circuit of the second embodiment.
Figure 6:
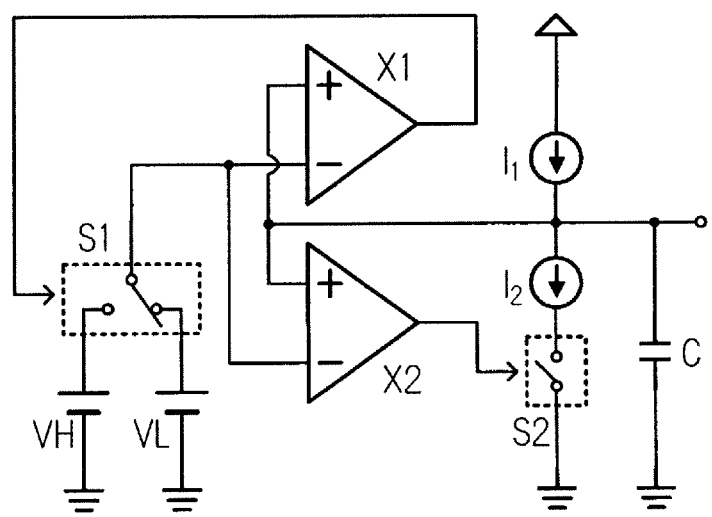
FIG. 6 is a circuit diagram for illustrating a related-art CR oscillator circuit.

Next, operation of the CR oscillator circuit of the second embodiment is described. FIG. 5 is an operation waveform of the CR oscillator circuit of the second embodiment.

At time T0, the EN terminal is LOW, and hence the DFF 90 is reset to output LOW from the Q terminal. The two input terminals of the EXOR 80 are LOW and the output terminal of the EXOR 80 is thus LOW. Consequently, the switch 16 is turned off.

When the EN terminal becomes HIGH at time T1, the output terminal of the EXOR 80 becomes HIGH to turn on the switch 16, and hence the constant current source 22 charges the capacitor 40 with the current $I_{BOOST}$. Moreover, as described in the description of the operation of the first embodiment, the constant current source 20 charges the capacitor 40 with the current $I_{CHG}$ at time T1. As a result, the capacitor 40 is charged by the current $I_{CHG}$ of the constant current source 20 and the current $I_{BOOST}$ of the constant current source 22. For this reason, the voltage of the node SLOPE is increased faster. The node OSCOUT becomes HIGH when the voltage of the node SLOPE becomes equal to the reference voltage VH. The DFF 90 outputs, to the Q terminal, a result obtained by latching a voltage of the D terminal when the C terminal is raised, and hence the Q terminal becomes HIGH. Consequently, the output terminal of the EXOR 80 becomes LOW to turn off the switch 16, with the result that the charging operation of the constant current source 22 is stopped. Operation at and after time T2 is the same as that of the first embodiment.

The CR oscillator circuit of this embodiment can therefore provide an effect of shortening a period of time required for starting the oscillation operation.

As described above, the CR oscillator circuit of the present invention includes one voltage comparator, in which the voltage obtained by adding or subtracting the offset voltage to or from the reference voltage serves as the reference voltage of the voltage comparator. It is therefore possible to provide a CR oscillator circuit that achieves small current consumption, a small occupied area, and good oscillation frequency accuracy.

What is claimed is:

1. A CR oscillator circuit, comprising:
    a reference voltage circuit configured to switch between a first reference voltage circuit and a second reference voltage circuit configured to output a reference voltage lower than a reference voltage of the first reference voltage circuit, to thereby output a reference voltage;
    a first constant current source configured to charge a capacitor;
    a second constant current source configured to discharge the capacitor;
    a voltage comparator configured to input the reference voltage and a voltage of the capacitor;
    a logic circuit connected to an output terminal of the voltage comparator,
    the logic circuit being configured to simultaneously switch, in response to an output signal of the voltage comparator, between the reference voltage of the reference voltage circuit and the charge and discharge of the capacitor;
    a third constant current source configured to charge the capacitor; and
    a detection circuit configured to detect start of an oscillation operation,
    wherein the detection circuit is configured to operate the third constant current source for a predetermined period of time when the oscillation operation starts, to thereby increase a current charging the capacitor.

* * * * *